United States Patent [19]

Bonaria

[11] Patent Number: 5,192,907
[45] Date of Patent: Mar. 9, 1993

[54] ELECTRONIC MODULE HANDLING DEVICE FOR AN AUTOMATIC TEST APPARATUS

[75] Inventor: Luciano Bonaria, Turin, Italy
[73] Assignee: S.P.E.A. S.R.L., Turin, Italy
[21] Appl. No.: 763,929
[22] Filed: Sep. 23, 1991
[30] Foreign Application Priority Data
Sep. 25, 1990 [IT] Italy ................ 67713 A/90
Sep. 25, 1990 [IT] Italy ................ 67714 A/90
[51] Int. Cl.$^5$ ............................. G01R 31/02
[52] U.S. Cl. ................ 324/158 F; 324/158 P
[58] Field of Search ........... 324/158 F, 158 P, 72.5; 439/482, 824; 414/222, 224, 225; 901/6; 29/873

[56] References Cited
U.S. PATENT DOCUMENTS 4,771,234 9/1988 Cook et al. ............... 324/158 F
4,774,462 9/1988 Black .................... 324/158 F
4,818,933 4/1989 Kerschner et al. ......... 324/158 F
4,841,231 6/1989 Angelucci ............... 324/158 F

*Primary Examiner*—Vinh Nguyen
*Attorney, Agent, or Firm*—Helfgott & Karas

[57] ABSTRACT

A device in cludes two mechanisms mounted beside the two longitudinal sides of an adapter supporting the customary feelers of a test apparatus. Each mechanism is adustable transversely on the adapter, and includes a number of pulleys having coplanar parallel axes and engaging a respective edge of the printed circuit plate of an electronic module for testing. The mechanisms are activated by a common actuator against the action of springs so as to bring the plate into contact with the feelers. The pulleys of each mechanism are rotated simultaneously by a belt activated by a toothed drive roller so sized as to mesh with the respective mechanism regardless of the position of the same.

18 Claims, 10 Drawing Sheets

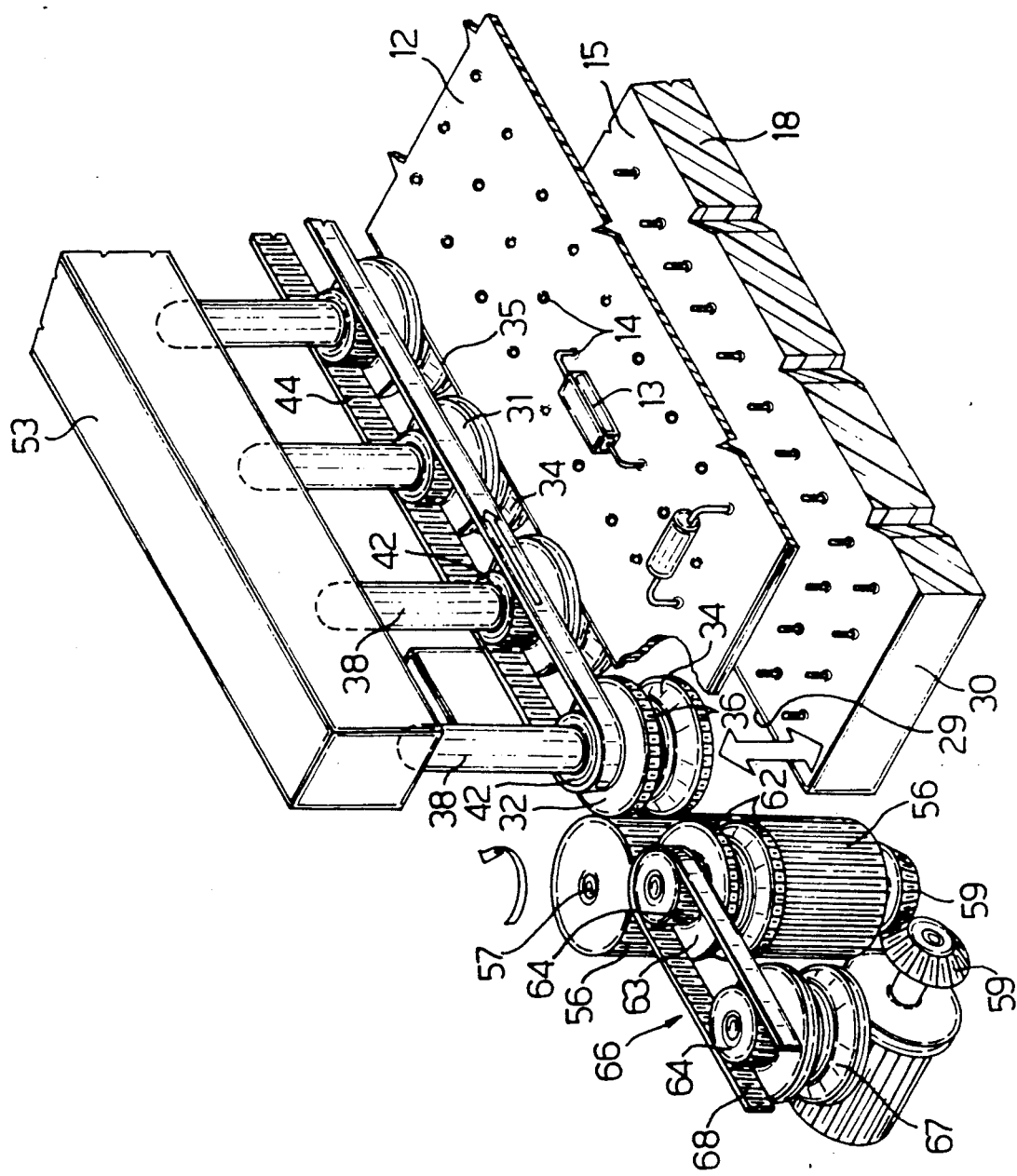

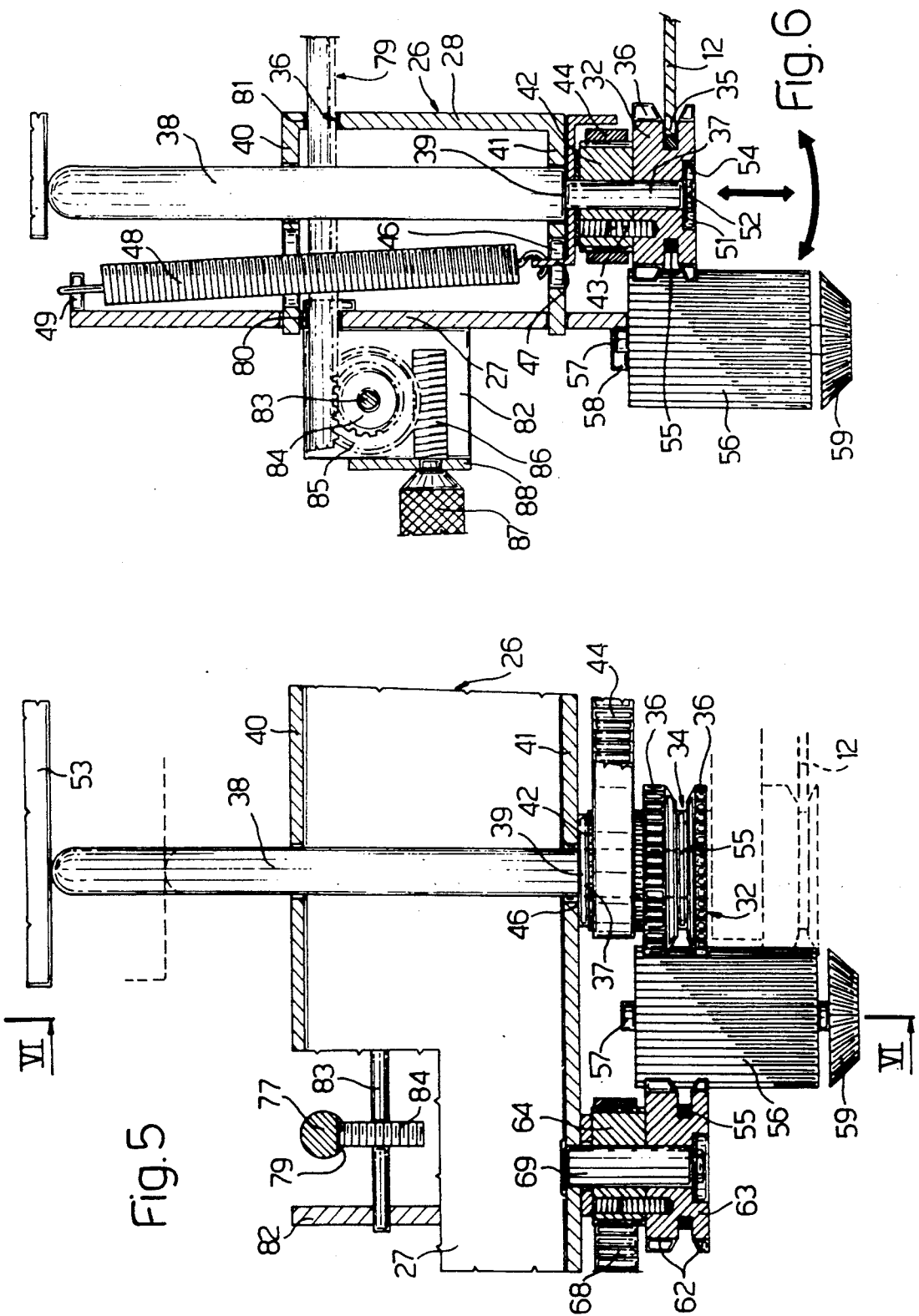

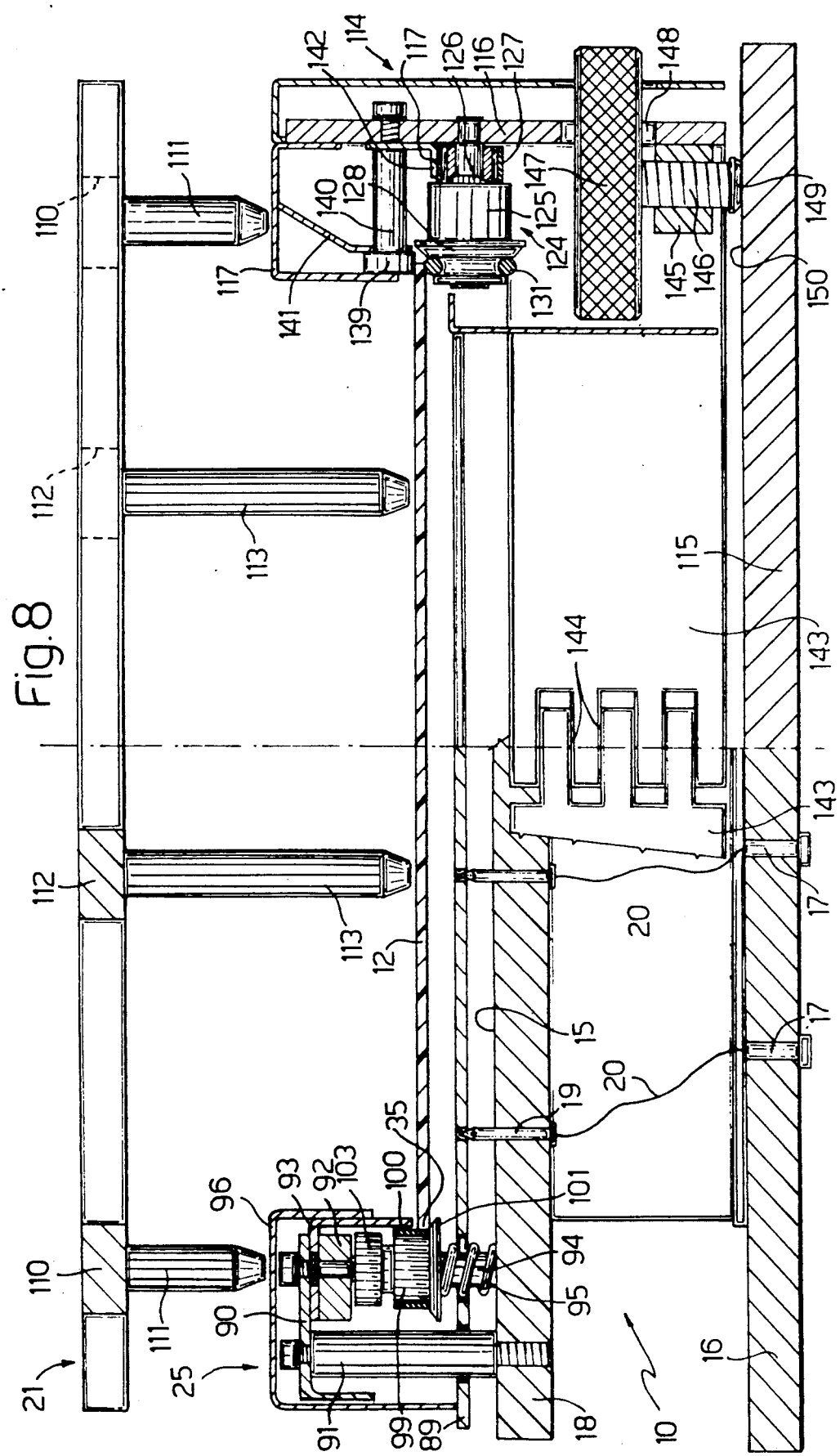

ELECTRONIC MODULE HANDLING DEVICE FOR AN AUTOMATIC TEST APPARATUS

BACKGROUND OF THE INVENTION

The present invention relates to an electronic module handling device for an automatic test apparatus, each module for testing comprising a printed circuit plate with a number of test points.

Known test equipment of the aforementioned type usually comprises a support for receiving a number of electrical connectors, and a support adaptable to the test module and fitted in interchangeable manner to the receiver. Each test module has a specific adapter, which presents a number of feelers or pins arranged according to the test points on the plate.

The test apparatus usually presents an electronic module handling device supported on the frame of the apparatus for receiving the test module, aligning the test points with the pins on the adapter, clamping the module so aligned, moving the module in relation to the adapter, and releasing and unloading the tested module. In addition to the complex design and high cost of known devices of the aforementioned type, they also require intricate adjustment for adapting to different sized modules, and are relatively slow-operating and unreliable.

SUMMARY OF THE INVENTION

It is an object of the present invention to provide a device for handling electronic modules comprising a printed circuit plate for testing, which device is both straightforward in design and provides for overcoming the aforementioned drawbacks typically associated with known devices.

According to the present invention, there is provided a device for handling electronic modules on an automatic test apparatus, each said test module comprising a printed circuit plate having a number of test points, and wherein an adapter is mounted in interchangeable manner on to a receiver, said adapter presenting a number of probes arranged according to the test points on said plate; characterised by the fact that it comprises two mechanisms adjustable in relation to said adapter; said plate being inserted between said mechanisms, on one side of said adapter; and said mechanisms being activated for aligning the test points on said plate with respective said probes.

BRIEF DESCRIPTION OF THE DRAWINGS

Two preferred non-limiting embodiments of the present invention will be described by way of example with reference to the accompanying drawings, in which:

FIG. 4 shows a larger-scale view in perspective of a detail in FIG. 2;

FIG. 5 shows a partial longitudinal section of the FIG. 4 detail;

FIG. 6 shows a section along line VI—VI in FIG. 5;

FIG. 8 shows a larger-scale cross section along line VIII—VIII in FIG. 7;

DETAILED DESCRIPTION OF THE INVENTION

Figure 1:
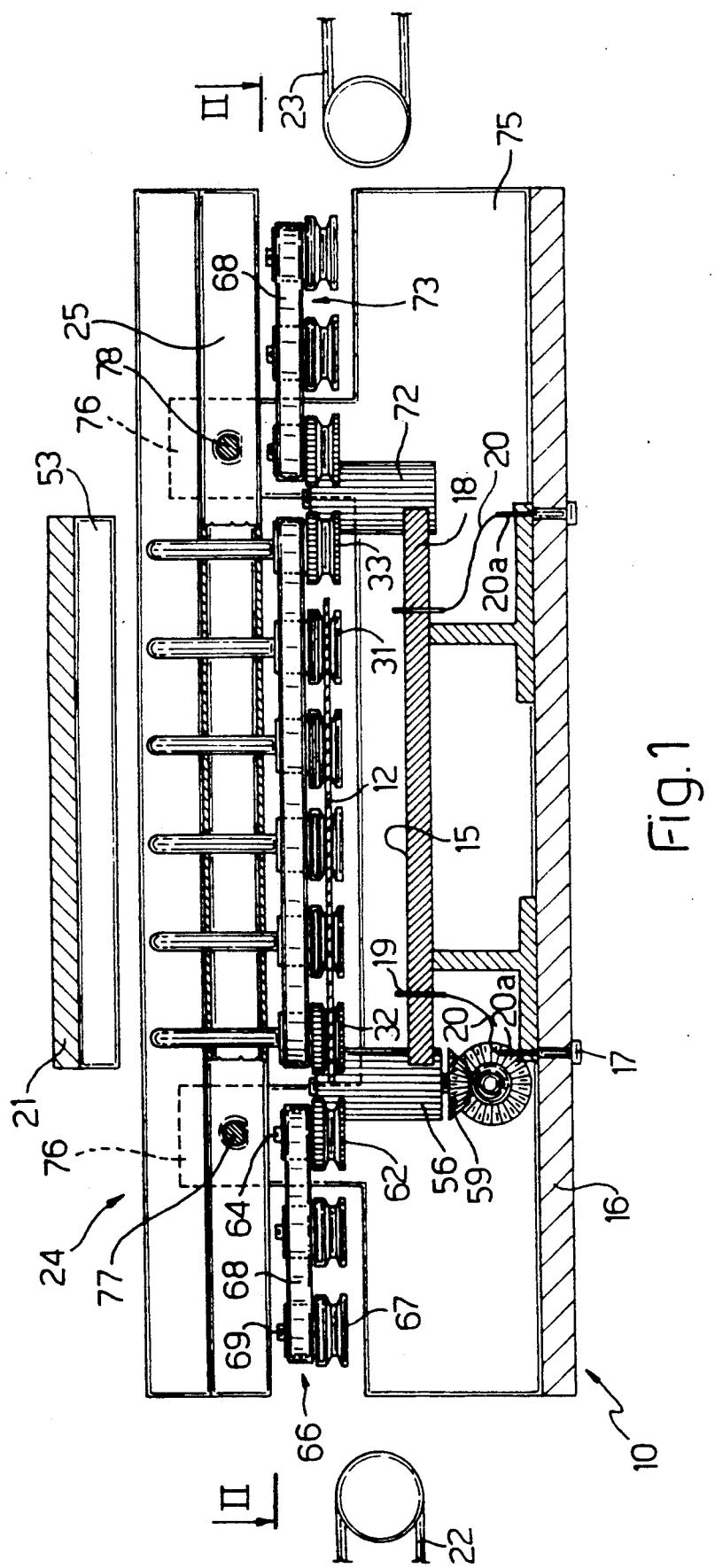
FIG. 1 shows a schematic longitudinal section of an electronic module testing apparatus featuring a handling device in accordance with a first embodiment of the present invention.
Figure 2:
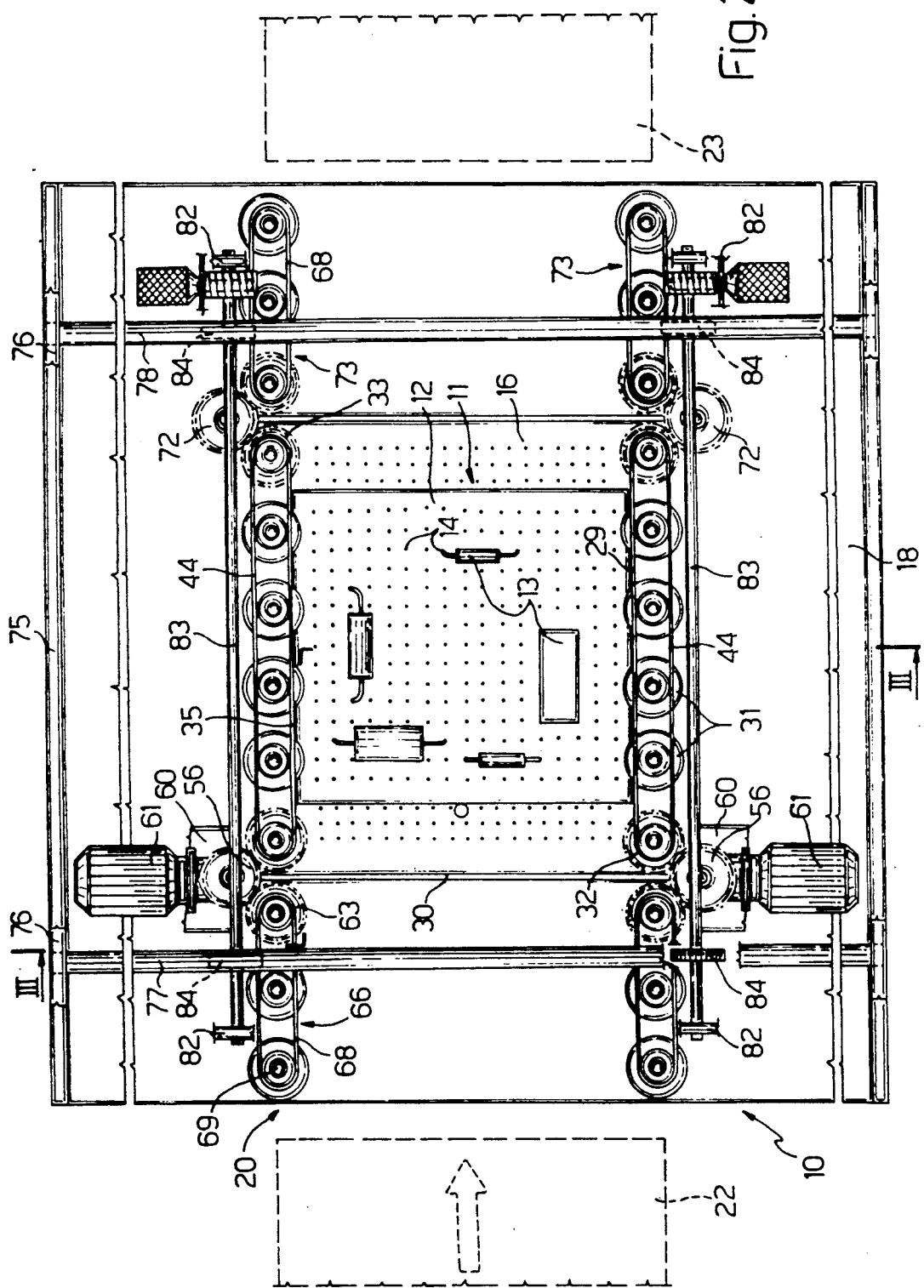
FIG. 2 shows a horizontal section along line II—II in FIG. 1.
Figure 3:
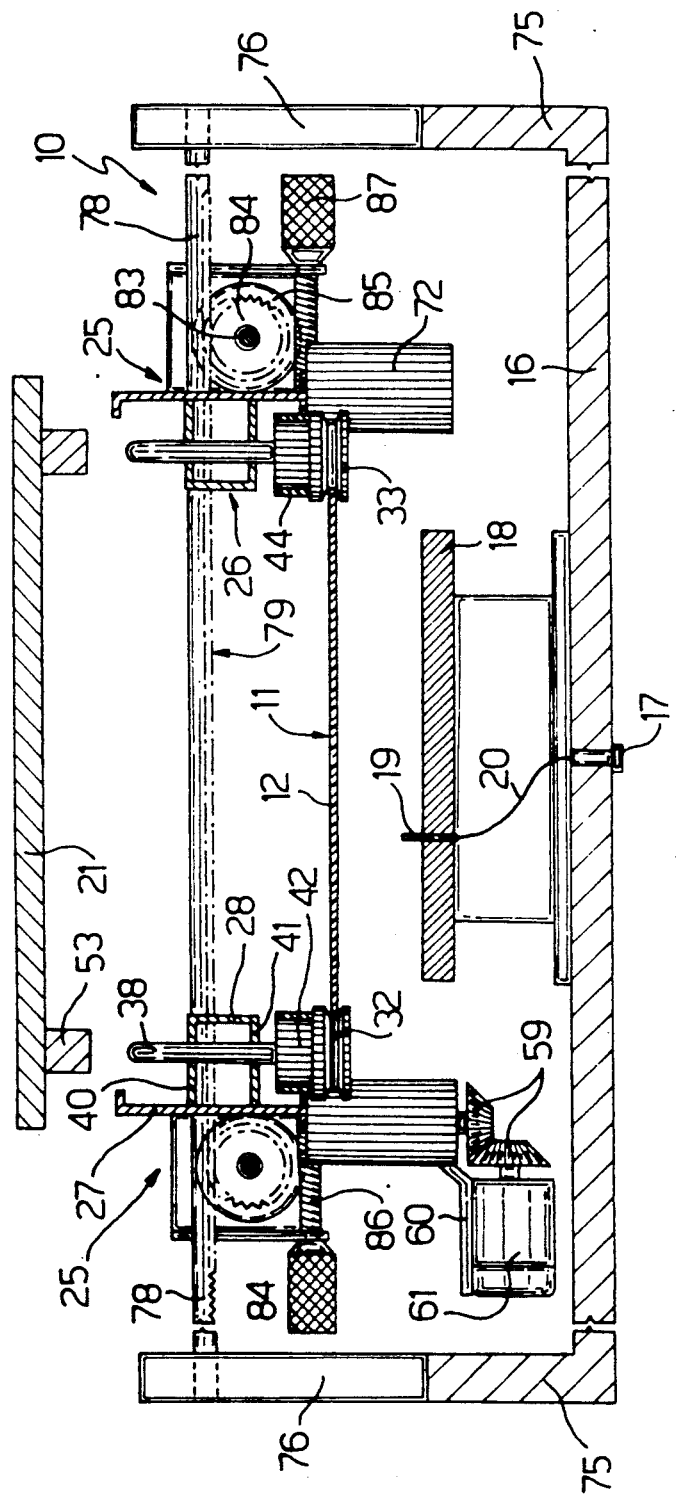
FIG. 3 shows a partial cross section along line III—III in FIG. 2.
Figure 7:
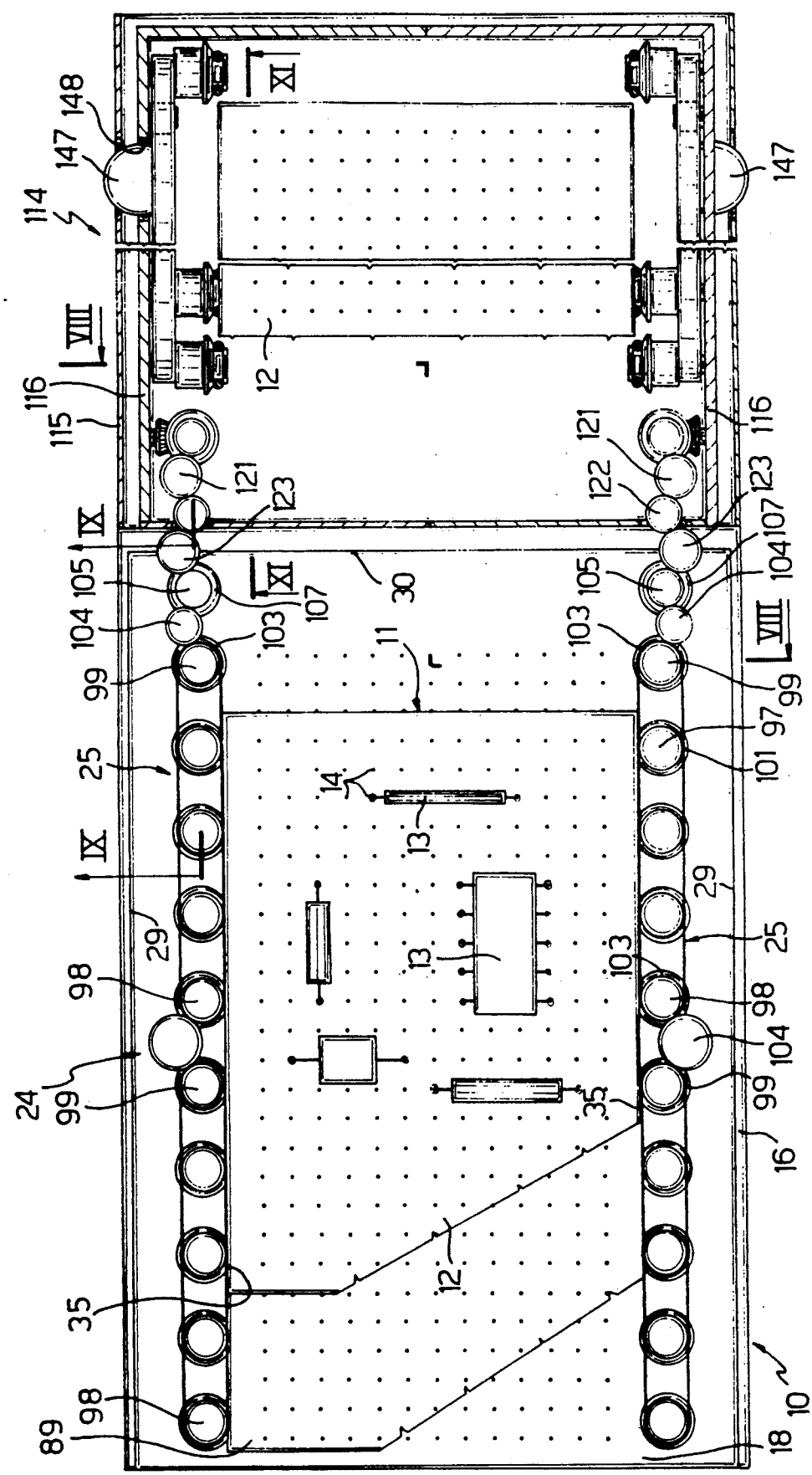
FIG. 7 shows a schematic horizontal section of an electronic module testing apparatus featuring a handling device in accordance with a further embodiment of the present invention.

Number 10 in FIGS. 1 to 3 indicates an apparatus for automatically testing electronic modules 11, usually as part of a mass production process. Hereinafter, the term "electronic module" is intended to mean any type of printed circuit support, either bare or ready for rack assembly. In particular, electronic module 11 comprises a printed circuit plate 12 (FIG. 2) on which may be mounted active and/or passive components 13, and which is usually rectangular in shape and of standard size. Each type of module 11 presents, on plate 12, a given grid network of test points 14.

Apparatus 10 comprises a fixed support 16 (FIG. 1), known as a receiver, to which may be fitted a number of electrical connectors 17 connected at one end to a computer programmed to test a specific plate 12; and an adaptable support 18 in the form of a plate having a rectangular upper surface 15.

Adapter 18 is mounted firmly in removable manner to receiver 16, and is fitted with a number of probes or pins 19 arranged matching test points 14 on plate 12. By means of wires 20 and connectors 20a inside receiver 16, pins 19 are connected separately to connectors 17 on receiver 16. Adapter 18 must thus be designed for testing a specific plate 12.

Apparatus 10 also comprises an actuator 21, which is moved towards receiver 16 for bringing test points 14 on plate 12 into contact with the tips of pins 19, as described in more detail later on. Plates 12 may be fed on to apparatus 10 by means of a conveyor 22, and unloaded either by means of an output conveyor 23 or back along conveyor 22.

According to a first embodiment of the present invention, apparatus 10 comprises an adjustable gripping device 24 on receiver 16, for receiving a test plate 12. In particular, device 24 comprises two mechanisms 25, each mounted on a metal box-section bar 26 having two vertical walls 27 and 28, and two horizontal walls 40 and 41.

Each mechanism 25 comprises a number of grooved intermediate pulleys 31 and grooved end pulleys 32 and 33. Each pulley 31-33 presents a V-shaped groove 34 (FIGS. 4 to 6) engaging a respective longitudinal edge 35 of plate 12. The outer edges of the two end pulleys 32 and 33 present a ring gear 36. Each pulley 31-33 is fitted with a respective toothed pulley 42, e.g. by means of a screw 43. Pulleys 42 of each mechanism 25 are engaged by a toothed belt 44 so as to turn synchronously.

Each pulley 42 is mounted for rotation on portion 37 (FIG. 6) of a respective pin 38 on which it forms a shoulder 39. Each pin 38 presents a rounded free end, and slides axially inside two holes in horizontal walls 40 and 41 of bar 26. The axes of pins 38 are coplanar and perpendicular to surface 15 of adapter 18, so that the axes of pulleys 31-33 are parallel.

Portion 37 (FIG. 6) of each pin 38 of mechanism 25 is inserted inside a respective hole in a Z-section plate 46, the bent edge 47 of which is connected to the bent edge 49 of wall 27 by means of a helical spring 48 by which plate 46 is normally held resting on bottom wall 41 of bar 26. Each pulley 31-33 is mounted on portion 37 of respective pin 38 by means of a washer 51 and a nut 52 screwed on to the threaded end of portion 37, so that pulleys 42 are maintained contacting respective plates 46.

Actuator 21 presents two longitudinal bars 53 (FIG. 3) for respective mechanisms 25. Each bar 53 simultaneously engages the free ends of pins 38 of respective mechanism 25, so as to move pulleys 31, 32 and 33, together with pins 38 and plates 46, against the action of springs 48 (FIG. 6). It will be noted that each pulley 31-33 presents a recess 54 at the bottom for housing washer 51 and threaded nut 52 flush with the bottom surface of the pulley, thus enabling mechanisms 25 to move plate 12 as close as possible to adapter 18.

Each groove 34 on pulleys 31-33 houses a ring 55 (FIGS. 5 and 6) made of material having a high friction coefficient, so that, when pulleys 31-33 are rotated, rings 55 engage edges 29 of plate 12 so as to displace it longitudinally in slidefree manner. The shape and size of groove 34 are such as to position plate 12 extremely accurately, both crosswise and in height.

Ring gear 36 of each pulley 32 meshes permanently with a respective toothed roller 56 rotating on a vertical shaft 57 supported on a bent tab portion 58 of wall 27 (FIG. 6). The height of roller 56 is such as to enable engagement by ring gear 36 regardless of the vertical position of pulley 32. Roller 56 is rotated, via a pair of bevel gears 59, by a respective electric motor 61 supported on an appendix 60 of wall 27 and controlled numerically, e.g. a step motor.

Toothed roller 56 is also engaged by ring gear 62 (FIGS. 4 and 5) of a grooved pulley 63 having a retaining ring 55. Pulley 63 is integral with a toothed pulley 64 with which it forms a pair identical to pair 32-42 and forming part of a drive unit indicated as a whole by 66 (FIG. 6). Each drive unit 66 comprises a number of grooved pulleys 67, e.g. two, similar to pulleys 31 and each integral with a toothed pulley 64. Pulleys 64 are rotated simultaneously by a toothed belt 68.

Each of grooved pulleys 63 and 67 is mounted on a shaft 69 (FIG. 5) supported on wall 41 of bar 26. Shafts 69 are axially fixed, but keep pulleys 63 and 67 in the same horizontal plane as pulleys 31-33 in the top idle position. Units 66 therefore provide for transversely aligning plate 12 and transferring it from input conveyor 22 to mechanisms 25.

Ring gear 36 of the other end pulley 33 of each mechanism 25 (FIGS. 1 to 3) in turn meshes with an idle toothed roller 72 activating a respective drive unit 73 symmetrical with unit 66 and also supported on bar 26. The two units 73 provide for transferring plate 12 from adapter 18 to unloading conveyor 23.

The test apparatus operates as follows.

Plate 12 is fed by input conveyor 22 on to the two drive units 66, where it is arrested on a locator (not shown) and centered transversely by pulleys 63 and 67 in relation to adapter 18. Both motors 61 are then operated a given number of steps, so as to each drive belts 44 and 68 via toothed roller 56 and ring gears 36 and 62 of pulleys 31 and 63.

Plate 12 is fed on to mechanisms 25 from one of the transverse sides 30 of adapter 18, and is engaged between pulleys 31-33 by which it is moved into a position wherein test points 14 are aligned longitudinally with respective pins 19 on adapter 18. Actuator 21 is moved down and, by means of the two bars 53, moves all the pins 38 on mechanisms 25 simultaneously downwards against the action of springs 48 (FIG. 6). Pulleys 31-33 therefore also move down into the position shown by the dotted lines in FIG. 5, so as to bring test points 14 on plate 12 (FIGS. 1 to 3) into contact with respective pins 19.

Actuator 21 is then moved back up to enable springs 48 (FIG. 6) to raise plates 46 together with pins 38, pulleys 31-33 and tested plate 12. Finally, motors 61 (FIG. 2) are again operated for driving belts 44 via roller 56; plate 12 engages the pulleys of units 73, the belts 68 of which are driven via ring gears 36 of pulleys 33 and roller 72; and the tested plate 12 is fed on to output conveyor 23.

Receiver 16 presents two sides 75, each having two appendixes 76 (FIG. 3) fitted with two round-section transverse bars 77 and 78 with teeth 79 at the bottom (FIGS. 5 and 6). Each bar 77 and 78 is fitted through two holes 80 and 81 in vertical walls 27 and 28 of box-section bars 26, so that bars 77 and 78 act as a transverse guide for bars 26.

Wall 27 of both bars 26 presents two drilled appendixes 82 in which is mounted for rotation a longitudinal shaft 83. Each shaft 83 is fitted with two pinions 84 engaging teeth 79 of transverse bars 77 and 78, so that each bar 26 is parallel at all times with the respective longitudinal side 29 of adapter 18 (FIG. 2). Each shaft 83 is also fitted with a helical gear 85 (FIG. 6) meshing with a worm screw 86 integral with a respective hand knob 87. Worm screw 86 rotates in a seat on a tab 88 of respective drilled appendix 82.

When one of knobs 87 is turned, the respective worm screw 86 turns helical gear 85 together with respective shaft 83 and pinions 84. These therefore roll simultaneously along toothed bars 77 and 78, so as to move respective bar 26, and respective mechanism 25, transversely and parallel to itself. By virtue of being irreversible, the worm screw 86-helical gear 85 pair provides for locking mechanism 25 in position and so enabling each to be adapted individually to the width and location of test plate 12.

In the embodiment shown in FIGS. 7 to 12, adapter 18 of apparatus 10 is fitted in removable manner to receiver 16, and presents a drilled plate 89 (FIG. 8) movable in the direction of surface 15 as described later on, and which provides for protecting and guiding pins 19 on adapter 18. Gripping device 24 comprises two mechanisms 25 (FIG. 7), each supported on a longitudinal L-section bar 90 fitted in removable manner to adapter 18 by means of pins 91 and parallel to longitudinal side 29 of adapter 18.

Each bar 90 is fitted with a longitudinal prismatic bar 92 in turn fitted with a section 93 sliding on two pins 94 fitted to L-section bar 90. Each pin 94 has a helical compression spring 95 (FIGS. 9 and 10) for pushing section 93 upwards. Bar 92 is fitted with a box bar 96 having an upside down U section and covering bar 90. Drilled plate 89 is secured in known manner to two bars 92.

Figure 10:
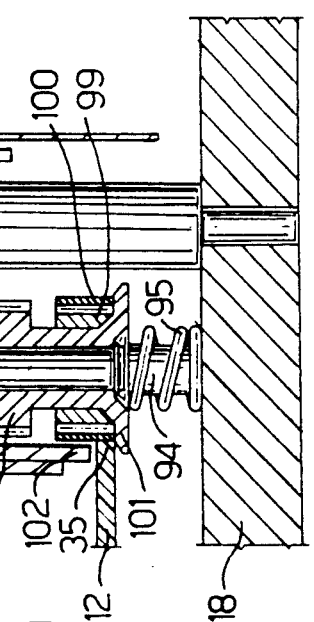
FIG. 10 shows a section along line X—X in FIG. 9.
Figure 9:
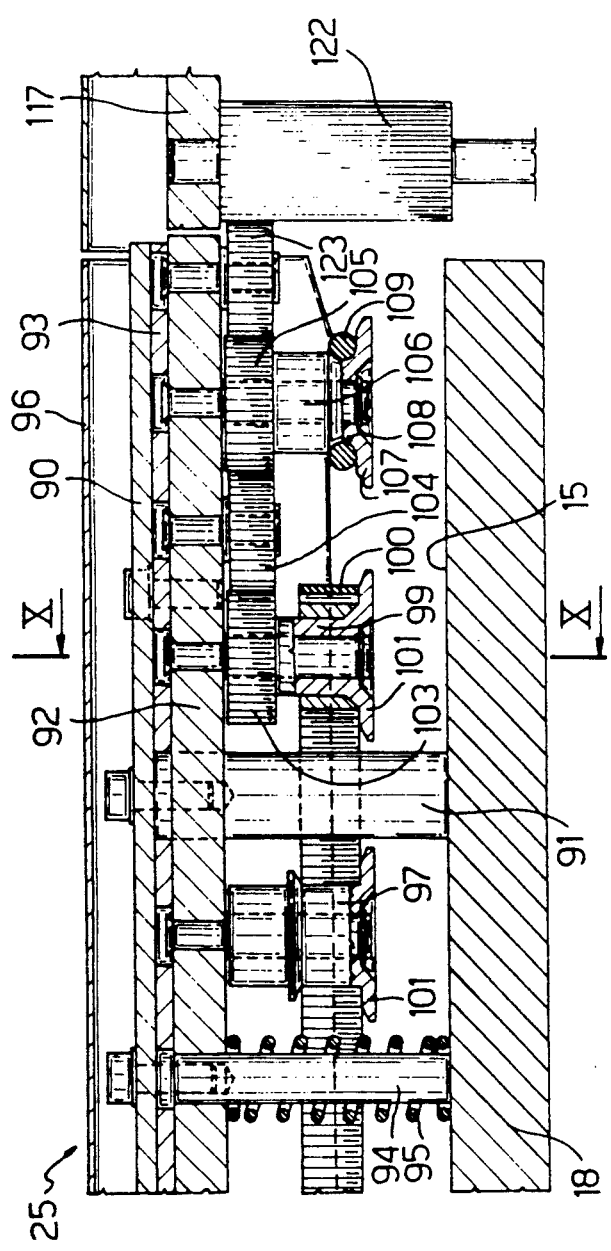
FIG. 9 shows a larger-scale, partial longitudinal section along line IX—IX in FIG. 7.

Each bar 92 presents a drive unit comprising a number of intermediate pulleys 97 and end pulleys 98 and 99, rotating on coplanar vertical shafts. Pulleys 97-99 are engaged by a polyurethane drive belt 100, which also engages an end flange 101 on each pulley 97-99. A polished vertical flange 102 on section 93 provides for adhering belt 100 to pulleys 97-99. The two longitudinal edges 35 of printed circuit plate 12 (FIGS. 7 and 8) are engaged by belts 100 of both mechanisms 25, and rest on the flat inner surface of each flange 101 (FIG. 10).

Each of end pulleys 98 and 99 (FIGS. 7 and 9) also presents a toothed pinion 103, that of pulley 99 meshing with a gear 104 mounted for rotation on bar 92. In the case of relatively long plates 12, and consequently relatively long bars 90, each bar 90 may be fitted with two identical drive units, so that gear 104 of the second unit meshes with pinion 103 of pulley 98 of the first unit, thus operating both units synchronously. Gear 104 of the first unit, on the other hand, meshes with pinion 105 (FIG. 10) of an additional pulley 106 having a flange 107 and a groove 108 housing a ring 109 of elastic material engaging respective edge 35 of plate 12.

Actuator 21 of apparatus 10 consists of a frame having two lateral bars 110 (FIG. 8), each having at least two rods 111 engaging respective box bar 96. The frame also comprises intermediate bars 112 having further rods 113 directly engaging plate 12 and adjustable on rods 112 for engaging specific circuit points on plate 12.

Apparatus 10 also comprises a loading and unloading unit 114 (FIGS. 7 and 8) in turn comprising a fixed supporting plate 115 and two sides 116. Each side 116 is fitted with a structure 117 housing a respective drive unit 118 (FIG. 11) comprising a reversible epicyclic geared motor 119 which, via a bevel gear pair 120, turns a gear 121 meshing with a toothed roller 122 rotating on structure 117.

Pinion 105 of pulley 106 (FIGS. 7 and 9) meshes with an idle gear 123 rotating on bar 92 and in turn meshing with roller 122, which is so sized as to mesh with gear 123 regardless of the vertical position of bar 92. Unit 114 can be moved longitudinally in relation to receiver 16, and roller 122 is brought into engagement with gears 123 by simply moving unit 114 longitudinally towards gripping device 24. Drive unit 118 (FIG. 11) is thus mounted, not on adapter 18, but on loading and unloading unit 114, thus reducing the cost of the variable equipment of apparatus 10.

Each side 116 of unit 114 (FIGS. 7 and 12) is also fitted with a drive unit 124 comprising a number of pulleys 125 rotating on coplanar horizontal shafts, and each having a toothed pinion 126 meshing with a toothed belt 127. Each pulley 125 presents a flange 128 having a conical surface 129 engaging edge 35 of test plate 12; and a groove 130 housing a retaining ring 131 on which edge 35 of plate 12 rests.

Belt 127 also engages a further toothed pulley 132 (FIG. 11) pivoting on a shaft 133 so located as to only engage belt 127 on the upper side of pulleys 125. A belt tensioner 134 provides for adjusting the tension of belt 127. Pulley 132 is driven by gear 121 via a pinion 135 and a bevel gear pair 136. Pinion 135 is integral with a further grooved pulley 137 having a retaining ring 138 in the same horizontal plane as ring 109 of pulley 106 (FIG. (9), and engages edge 35 of plate 12 (FIG. 7) so as to center plate 12 in relation to mechanisms 25.

Finally, loading and unloading unit 114 comprises a roller 139 (FIG. 11) rotating on a horizontal shaft 140 fitted to a flange 141 on structure 117. Roller 139 provides for adhering edge 35 of plate 12 to rings 131 of pulleys 125 and to ring 109 of pulley 105. Belt 127 is in turn held firmly against pinions 126 (FIG. 8) by a polished flange 142 fitted to respective side 116.

The FIG. 7-12 device operates as follows.

Figure 11:
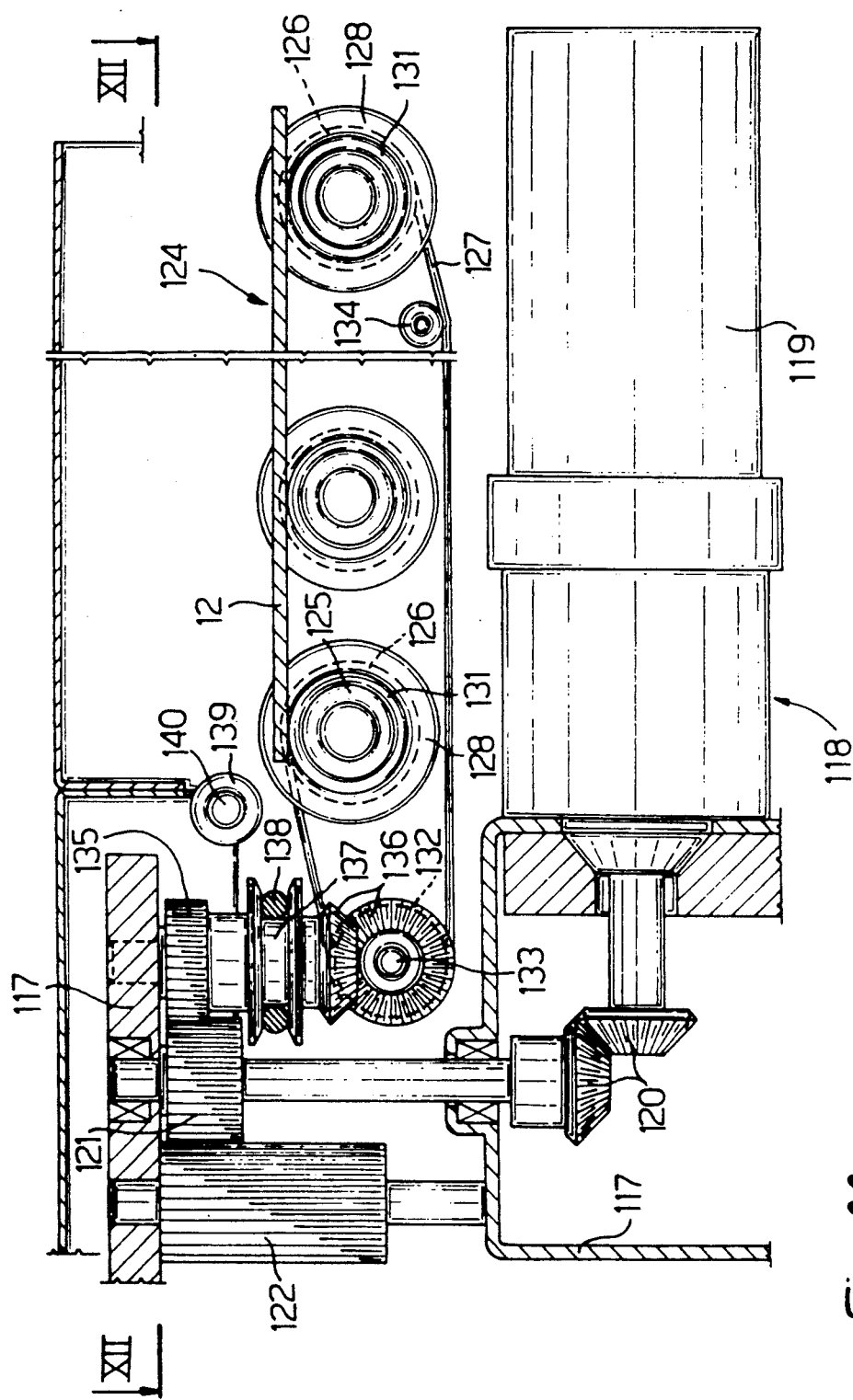
FIG. 11 shows a larger-scale, partial longitudinal section along line XI—XI in FIG. 7.
Figure 12:
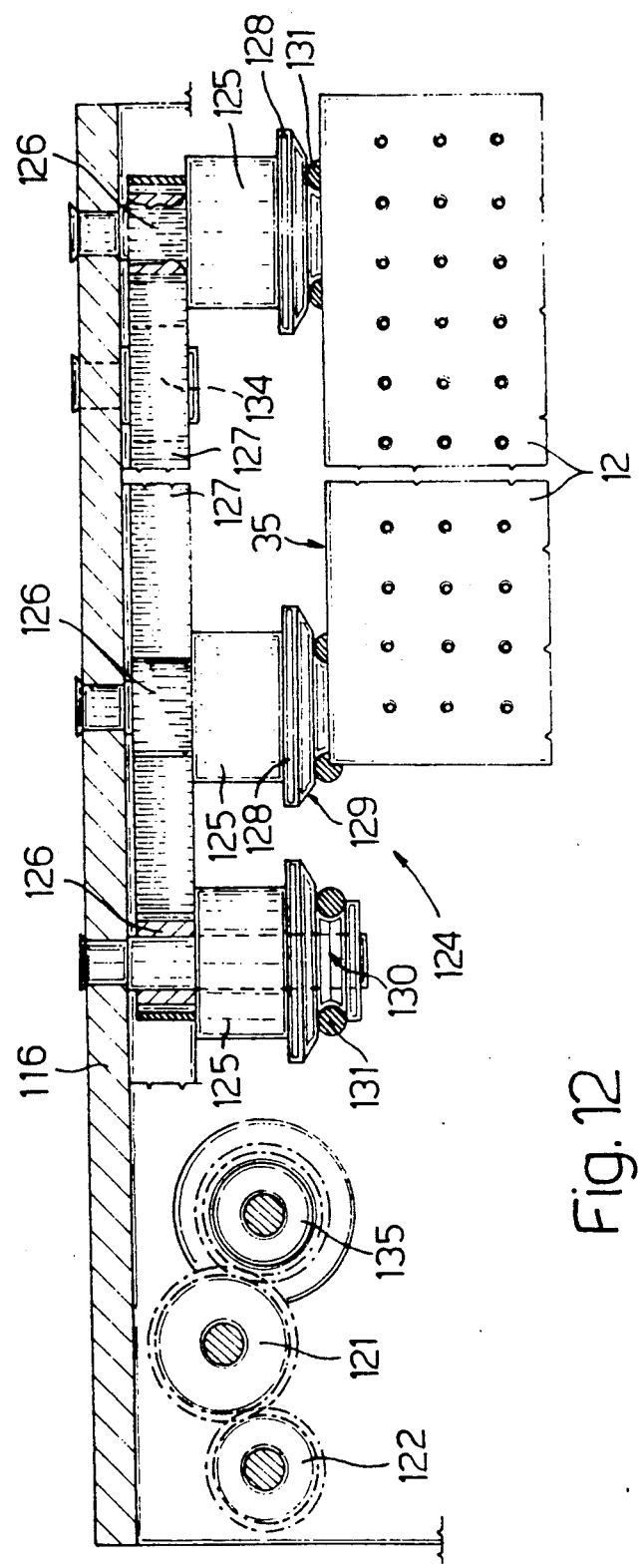
FIG. 12 shows a partial section along line XII—XII in FIG. 11.

Printed circuit plate 12 for testing may be loaded on to unit 114 (FIG. 7) either manually or, for example, by means of an automatic loader, and is placed with lateral edges 35 resting on retaining rings 131 of pulleys 125 (FIGS. 11 and 12). The control circuit then operates geared motors 119 of both drive units 124 in such as direction as to rotate pulleys 132 anticlockwise. The same belts 127 thus turn all of pulleys 125 in the same direction, so that plate 12 is moved leftwards by retaining rings 131.

The two rollers 139 hold each edge 35 of plate 12 against ring 131 of the first pulley 125 on the left, so as to engage edge 35 with ring 138 of respective horizontal pulley 137. The two pulleys 137 are rotated in the opposite direction for feeding plate 12 on to gripping device 24 (FIG. 7) of adapter 18, through transverse side 30. Edges 35 of plate 12 are then driven by the drive units of mechanisms 25, via rings 109 of pulleys 105 (FIGS. 9 and 10) and belts 100, with edges 35 of plate 12 resting on the flat surface of flanges 101 and 107.

As plate 12 moves into the test position, geared motors 119 (FIG. 11) are stopped and actuator 21 (FIGS. 8 and 9) operated; rods 111 push box bars 96 together with bars 92 downwards against the action of springs 95; pulleys 97-99 lower plate 12 together with drilled plate 89; and, simultaneously, rods 113, engaging various points on plate 12, enable pins 19 to effectively test the circuit.

After testing, actuator 21 is moved back up; springs 95 raise mechanisms 25 together with plate 12; and geared motors 119 (FIG. 11) are operated in the opposite direction so as to load plate 12 on to loading and unloading unit 114 via mechanisms 25 and drive units 124.

Each side 116 of loading and unloading unit 114 is fitted at both ends with two transverse plates 143 (FIGS. 7 and 8) having mutual guide surfaces in the form of a toothed edge 144. Each side 116 also slides transversely in known manner on supporting plate 115, and presents a threaded block 145 engaged by a threaded shank 146. This is fitted on top with a knob 147 housed partially in an opening 148 in side 116 so that it can be turned manually from the outside of side 116. The bottom end of shank 146 presents a washer 149 of material having a high friction coefficient, and designed to engage a clamping surface 150 on supporting plate 115.

To adapt loading and unloading unit 114 to the width of each adapter 18, knobs 147 are turned for locking washers 149 and, consequently, the two sides 116, which may then be moved transversely over supporting plate 115 into the required position. The two sides 116 are then locked on surface 150 of supporting plate 115 by means of knobs 147 and washers 149.

The advantages of the handling devices according to the present invention will be clear from the foregoing description. In particular, mechanism 25 may be adjusted easily to the width of test plate 12, and provide for aligning and bringing plate 12 into contact with pins 19 of adapter 18, as well as for gripping, loading and unloading plate 12, thus providing for a high degree of reliability of the device. Finally, apparatus 10 according to the FIG. 7-12 embodiment is even more economical, by virtue of mechanisms 25 being mounted in removable manner on adapter 18 itself, and being operated by the same motors as loading and unloading unit 114.

To those skilled in the art it will be clear that changes and improvements may be made to the loading and unloading device as described and illustrated above without, however, departing from the scope of the present invention. For example, to simplify design, pulleys 31-33 and 97-99 may all be the same, and a single motor 61 or 119 may be provided for both mechanisms 25.

I claim:

1. An automatic test apparatus for electronic modules of which each module has a printed circuit plate provided with a plurality of test points, the apparatus comprising a fixed support; means for gripping and handling printed circuit plates of said electronic modules; an adapter removably mounted on said fixed support and provided with a plurality of probes arranged thereon in accordance with said plurality of test points on a printed circuit plate being tested in the apparatus; movable actuating means for moving said gripping means and causing said plate to move towards said adapter, said gripping and handling means including a pair of mechanism engaging a pair of opposite side edges of said plate, respectively, each of said mechanisms including a gripping member for gripping a respective one of said side edges, each gripping member, upon actuation of the respective mechanism by said actuating means, conveying said plate to a test position in which said test points are in alignment with said probes and said actuating means simultaneously displacing said gripping members for moving said plate in an aligned position with said probes so as to bring said test points in contact with said probes.

2. An apparatus as claimed in claim 1, wherein each gripping member includes a drive belt and a plurality of pulleys having parallel coplanar axes and engaging a respective side edge; said pulleys being rotated by said drive belt.

3. An apparatus as claimed in claim 2, further comprises an electric motor and a toothed drive roller for driving at least one of said pulleys wherein each of said mechanisms has a ring gear and wherein said toothed roller is engaged by a respective ring gear regardless of a position of the respective mechanism.

4. An apparatus as claimed in claim 2, wherein each said pulley includes a V-shaped groove for engaging said respective side edge and wherein each of said mechanisms includes a longitudinal support and a plurality of pins, each pulley being mounted on a respective pin sliding axially on said longitudinal support; said actuating means comprising at least one bar for simultaneously activating said pins and wherein elastic means are provided for normally maintaining said pins in an idle axial position on said longitudinal support.

5. An apparatus as claimed in claim 4, wherein each longitudinal support is mounted in adjustable manner on a respective side of said fixed support and includes at least one unit for loading and unloading said plate; each loading and unloading unit including at least two grooved pulleys and a toothed belt for synchronously rotating said grooved pulleys; one of said grooved pulleys of said unit having a ring gear (64) meshing with said toothed roller.

6. An apparatus as claimed in claim 4, and further comprising moving means activated for moving each longitudinal support transversely on said fixed support.

7. An apparatus as claimed in claim 6, and further comprising at least one transverse bar for movably mounting each said longitudinal support and having a toothed edge; said moving means including at least one pinion mounted on each longitudinal support and engaging said toothed edge.

8. An apparatus as claimed in claim 6, and further comprising two transverse bars, each having a toothed edge and wherein each said longitudinal support is formed of a box-shaped bar having two vertical walls, said vertical walls each having two holes receiving and guided transversely by said two transverse bars; said moving means including a pair of longitudinal shafts each rotating on the respective box-shaped bar; said longitudinal shafts each being integral with two pinions meshing with the toothed edge of a respective transverse bar.

9. An apparatus as claimed in claim 8, wherein each of said mechanisms further includes a helical gear, a worm screw and an activating knob and wherein each of said longitudinal shafts is fitted with a respective helical gear driven by a respective worm screw and forming with said helical gear a transmission unit; said worm screw being activated by a respective activating knob.

10. An apparatus as claimed in claim 2, wherein each gripping member includes a longitudinal support on which said pulleys are mounted, and wherein a ring gear is provided rotatably one each longitudinal support; and further comprising a unit for loading and unloading plates of the electronic modules, said unit including two drive units, each drive unit including a toothed roller and an electric motor for rotating said roller; said loading and unloading unit being movable longitudinally for causing respective toothed rollers to mesh with respective ring gears.

11. An apparatus as claimed in claim 10, wherein each said drive unit comprises a toothed belt, and a plurality of grooved pulleys each having a retaining ring and rotating on coplanar horizontal shafts, said pulleys being rotated synchronously by said toothed belt so that said plate is driven by said retaining ring on each of said grooved pulleys.

12. An apparatus as claimed in claim 11, wherein each said drive unit further comprises a further grooved pulley for rotating on a vertical shaft synchronously with the respective toothed belt; each further pulley having a retaining ring engaging a respective side edge of said plate (12).

13. An apparatus as claimed in claim 12, wherein each said drive unit is adjustable transversely in respect to said adapter; and further comprising clamping means activated manually for clamping each said drive unit in a set transverse position.

14. An apparatus according to claim 2, wherein said adapter has a work surface and each of said mechanisms and wherein each of said longitudinal shafts is fitted with a respective helical gear driven by a respective worm screw and forming with said helical gear a transmission unit; said worm screw being activated by a respective activating knob.

15. An apparatus as claimed in claim 14, wherein each gripping member includes a longitudinal support and wherein said pulleys of said gripping member are mounted on said longitudinal support movable parallel to an axis thereof; said actuating means including at least two rods acting on said longitudinal support for enabling said pulleys to move said plate towards said work surface; and further comprising elastic means for normally maintaining said longitudinal supports in an idle position on said adapter.

16. An apparatus as claimed in claim 15, wherein each of said mechanisms further includes an endless belt, each of said pulleys having a flange engaging said endless belt, each of said side edges of said plate being engaged by the respective endless belt of the respective mechanism so that said plate also rests on the flange of each pulley.

17. An apparatus as claimed in claim 16, wherein each of said mechanisms further comprises a grooved pulley for rotating synchronously with said belt, said grooved pulley including an elastic ring for engaging said side edge of said plate.

18. An automatic test apparatus for electronic modules, each module having a substantially rectangular printed circuit plate provided with a plurality of test points, the apparatus comprising a fixed receiver; means for holding and handling a printed circuit plate of each electronic module being tested; an adapter removably mounted on said receiver, said adapter having a substantially rectangular work surface provided with a number of probes arranged in accordance with said test points; and actuating means acting on said handling means for causing said plate to move towards said work surface, said handling means including a pair of mechanisms engaging a pair of opposite side edges of said plate, respectively, and each including a gripping member for gripping one of said side edges, said mechanisms holding said plate therebetween so that said side edges are perpendicular to one side of said adapter, each gripping member, upon actuation of said handling means by said actuating means, conveying said plate to a test position in which said test points are in alignment with said test probes, said actuating means displacing each gripping member for moving said plate in an aligned position perpendicular to said work place so as to bring said test points in contact with said probes.

* * * * *